US012446242B2

(12) United States Patent
Lin et al.

(10) Patent No.: US 12,446,242 B2
(45) Date of Patent: Oct. 14, 2025

(54) SEMICONDUCTOR DEVICE AND METHOD OF MANUFACTURING THE SAME

(71) Applicant: RENESAS ELECTRONICS CORPORATION, Tokyo (JP)

(72) Inventors: Zhichao Lin, Tokyo (JP); Koji Ogata, Tokyo (JP); Yukio Takahashi, Tokyo (JP); Tomohiro Imai, Tokyo (JP); Tetsuya Yoshida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 464 days.

(21) Appl. No.: 18/052,382

(22) Filed: Nov. 3, 2022

(65) Prior Publication Data

US 2023/0197827 A1    Jun. 22, 2023

(30) Foreign Application Priority Data

Dec. 16, 2021 (JP) ................................ 2021-203814

(51) Int. Cl.
*H10D 62/00* (2025.01)
*H01L 21/265* (2006.01)
(Continued)

(52) U.S. Cl.
CPC ..... *H10D 12/038* (2025.01); *H01L 21/26513* (2013.01); *H01L 21/28185* (2013.01);
(Continued)

(58) Field of Classification Search
CPC .. H10D 12/038; H10D 12/481; H10D 62/112; H10D 62/142; H10D 30/0297;
(Continued)

(56) References Cited

U.S. PATENT DOCUMENTS 5,835,985 A * 11/1998 Hiyoshi ............... H10D 84/136
257/128
6,399,998 B1 * 6/2002 Chang .................. H10D 62/393
257/586
(Continued)

FOREIGN PATENT DOCUMENTS

JP    2004-119616 A    4/2004
JP    2005-026391 A    1/2005
(Continued)

OTHER PUBLICATIONS

Office Action dated Feb. 4, 2025, issued in corresponding Japanese patent application No. 2021-203814, 10 pages.

*Primary Examiner* — Sheikh Maruf

(74) *Attorney, Agent, or Firm* — Rimon P.C.

(57) ABSTRACT

A gate electrode is formed inside a trench via a gate insulating film. The gate insulating film formed on a semiconductor substrate is removed. An insulating film is formed on the semiconductor substrate. A p-type base region is formed in the semiconductor substrate. An n-type emitter region is formed in the base region. Hydrogen annealing process is performed to the semiconductor substrate. A boundary between the base region and the emitter region is located at a position deeper than the insulating film formed between a side surface of the trench and the gate insulating film.

7 Claims, 16 Drawing Sheets

(51) Int. Cl.
  *H01L 21/28* (2006.01)
  *H10D 12/00* (2025.01)
  *H10D 12/01* (2025.01)
  *H10D 62/10* (2025.01)
  *H10D 62/13* (2025.01)

(52) U.S. Cl.
  CPC ..... *H01L 21/28211* (2013.01); *H10D 12/481* (2025.01); *H10D 62/112* (2025.01); *H10D 62/142* (2025.01)

(58) Field of Classification Search
  CPC .. H10D 30/668; H10D 62/106; H10D 62/393; H10D 64/232; H10D 64/256; H10D 64/68; H10D 62/10; H10D 62/126; H01L 21/26513; H01L 21/28185; H01L 21/28211
  USPC .......................................................... 257/143
  See application file for complete search history.

(56) References Cited

U.S. PATENT DOCUMENTS

| | | | | |
|---|---|---|---|---|
| 7,638,839 | B2* | 12/2009 | Arai | H10D 64/513 |
| | | | | 257/E29.198 |
| 9,041,050 | B2 | 5/2015 | Matsuura | |
| 2003/0020134 | A1* | 1/2003 | Werner | H10D 30/665 |
| | | | | 257/E29.257 |
| 2005/0218430 | A1* | 10/2005 | Kelberlau | H10D 8/411 |
| | | | | 257/E29.328 |
| 2006/0054970 | A1* | 3/2006 | Yanagida | H10D 30/0297 |
| | | | | 257/E29.066 |
| 2008/0217649 | A1* | 9/2008 | Arai | H10D 64/513 |
| | | | | 363/135 |
| 2011/0291223 | A1* | 12/2011 | Nakamura | H01L 23/3171 |
| | | | | 257/493 |
| 2012/0132955 | A1* | 5/2012 | Saito | H10D 62/142 |
| | | | | 257/140 |
| 2013/0175574 | A1* | 7/2013 | Matsuura | H10D 62/106 |
| | | | | 438/138 |
| 2018/0076289 | A1* | 3/2018 | Kurokawa | H10D 30/668 |
| 2018/0358449 | A1* | 12/2018 | Zeng | H10D 30/0295 |
| 2018/0366569 | A1* | 12/2018 | Zeng | H10D 62/393 |

FOREIGN PATENT DOCUMENTS

| | | |
|---|---|---|
| JP | 2006-080177 A | 3/2006 |
| JP | 2008-177279 A | 7/2008 |
| JP | 2013-140885 A | 7/2013 |

* cited by examiner

<STUDIED EXAMPLE>

SEMICONDUCTOR DEVICE AND METHOD OF MANUFACTURING THE SAME

CROSS-REFERENCE TO RELATED APPLICATIONS

The disclosure of Japanese Patent Application No. 2021-203814 filed on Dec. 16, 2021 including the specification, drawings and abstract is incorporated herein by reference in its entirety.

BACKGROUND

The present invention relates to a semiconductor device and a method of manufacturing the same, and particularly relates to a semiconductor device provided with a gate electrode formed inside a trench and a method of manufacturing the same.

As an IGBT (Insulated Gate Bipolar Transistor) having a low on-resistance, a trench-gate IGBT has been widely used.

There are disclosed techniques listed below.
[Patent Document 1] Japanese Unexamined Patent Application Publication No. 2013-140885

For example, Patent Document 1 discloses an IGBT having a GGEE structure. In such an IGBT, a trench is formed in an n-type semiconductor substrate, and a gate electrode is buried inside the trench via a gate insulating film. Also, a p-type base region is formed in the semiconductor substrate, and an n-type emitter region is formed in an upper portion of the base region. The base region and the emitter region are formed by performing ion implantation in a state where an insulating film different from the gate insulating film is formed on the semiconductor substrate.

SUMMARY

In a conventional manufacturing method, a gate insulating film is formed inside a trench and on a semiconductor substrate, a polycrystalline silicon film is deposited on the gate insulating film, and dry etching process is performed to the polycrystalline silicon film, whereby the polycrystalline silicon film on the semiconductor substrate is removed and the polycrystalline silicon film is buried in the trench. When performing ion implantation to the semiconductor substrate, the gate insulating film on the semiconductor substrate is used as a through film in order to reduce the damage on the semiconductor substrate.

However, since the gate insulating film has a relatively large thickness, the thickness of the gate insulating film is likely to vary when forming the gate insulating film and when performing the dry etching process to the polycrystalline silicon film. Therefore, the gate insulating film on the semiconductor substrate is removed and a new different silicon oxide film is formed by performing the reoxidation process. By performing the ion implantation using this silicon oxide film as a through film, the base region and the emitter region are formed. Note that the reoxidation process is the thermal oxidation process using oxygen gas, that is, the dry oxidation process.

Here, the studies by the inventors of this application have revealed that the interface state is increased by performing the reoxidation process and hydrogen ions are formed in the gate insulating film, resulting in the deterioration of PBTI (Positive Bias Temperature Instability). The deterioration of PBTI causes a problem that the threshold voltage fluctuates over time. Namely, the reliability of the semiconductor device is lowered.

A main object of this application is to improve the reliability of a semiconductor device by suppressing the deterioration of the PBTI. Other problems and novel features will be apparent from the description of this specification and accompanying drawings.

An outline of a typical embodiment disclosed in this application will be briefly described as follows.

A method of manufacturing a semiconductor device according to an embodiment includes steps of: (a) preparing a semiconductor substrate of a first conductivity type; (b) after the step (a), forming a trench in the semiconductor substrate; (c) after the step (b), forming a gate insulating film inside the trench and on the semiconductor substrate; (d) after the step (c), forming a first conductive film on the gate insulating film so as to fill an inside of the trench; (e) after the step (d), removing the first conductive film formed outside the trench, thereby forming a gate electrode made of the first conductive film inside the trench; (f) after the step (e), removing the gate insulating film formed on the semiconductor substrate; (g) after the step (f), forming a first insulating film on the semiconductor substrate; (h) after the step (g), forming a first impurity region of a second conductivity type opposite to the first conductivity type in the semiconductor substrate such that a bottom portion of the first impurity region is shallower than a bottom portion of the trench; (i) after the step (h), forming a second impurity region of the first conductivity type in the first impurity region; and (j) after the step (i), performing a hydrogen annealing process to the semiconductor substrate. Here, in the step (g), the first insulating film is formed also between a side surface of the trench and the gate insulating film, and a boundary between the first impurity region and the second impurity region is located at a position deeper than the first insulating film formed between the side surface of the trench and the gate insulating film.

A semiconductor device according to an embodiment includes: a semiconductor substrate of a first conductivity type; a trench formed in the semiconductor substrate; a gate insulating film formed inside the trench; a gate electrode formed on the gate insulating film so as to fill an inside of the trench; a first impurity region of a second conductivity type opposite to the first conductivity type formed in the semiconductor substrate such that a bottom portion of the first impurity region is shallower than a bottom portion of the trench; and a second impurity region of the first conductivity type formed in the first impurity region. Here, a first distance between the gate electrode and the second impurity region above a boundary between the first impurity region and the second impurity region is longer than a second distance between the gate electrode and the first impurity region below the boundary, the first distance becomes larger as it gets closer to an upper surface of the gate electrode, and a difference between the first distance at a position of the upper surface of the gate electrode and the second distance is 30 nm or more and 100 nm or less.

According to the embodiment, it is possible to improve the reliability of a semiconductor device.

DETAILED DESCRIPTION

Figure 1:
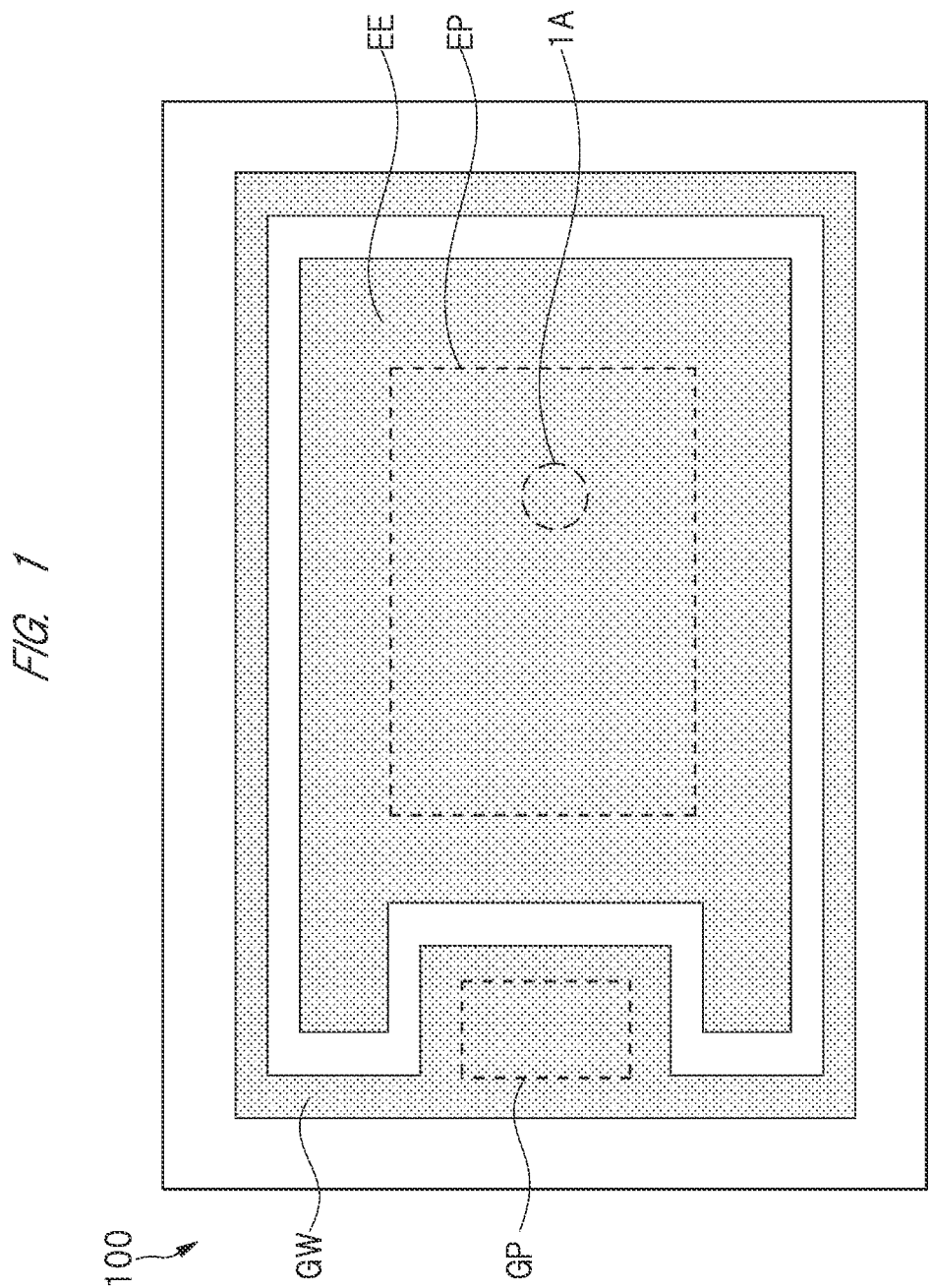
FIG. 1 is a plan view showing a semiconductor device according to the first embodiment.

Hereinafter, an embodiment will be described in detail with reference to drawings. In all the drawings for describing the embodiment, the members having the same function are denoted by the same reference characters and the repetitive description thereof is omitted. Also, in the following embodiment, the description of the same or similar components is not repeated in principle unless particularly required.

Further, in this application, when a numerical range such as "1 to 10 µm" is presented, it means "1 µm or more and 10 µm or less". The same applies to other numerical values and other units.

First Embodiment

<Structure of Semiconductor Device>

A structure of a semiconductor device 100 according to the first embodiment will be described below with reference to FIG. 1 and FIG. 2. The main feature of the first embodiment lies in a structure around an upper portion of gate electrodes GE1 and GE2 buried in trenches TR and a manufacturing method of the same. Such a feature will be described in detail later with reference to FIG. 12 to FIG. 20. Before that, the entire structure of the semiconductor device 100 and the manufacturing method of the same will be described.

FIG. 1 is a plan view showing a semiconductor chip which is the semiconductor device 100. As shown in FIG. 1, most of the semiconductor device 100 is covered with an emitter electrode EE. A gate wiring GW is formed around the emitter electrode EE. A region surrounded by a broken line in the emitter electrode EE is an emitter pad EP, and a region surrounded by a broken line in the gate wiring GW is a gate pad GP.

A part of each of the emitter electrode EE and the gate wiring GW is covered with a protective film (not shown). The regions exposed from the protective film serve as the emitter pad EP and the gate pad GP. Wire bonding or an external connection terminal such as a clip (copper plate) is connected to the emitter pad EP and the gate pad GP, so that the semiconductor device 100 is electrically connected to other semiconductor chips or wiring boards.

Figure 2:
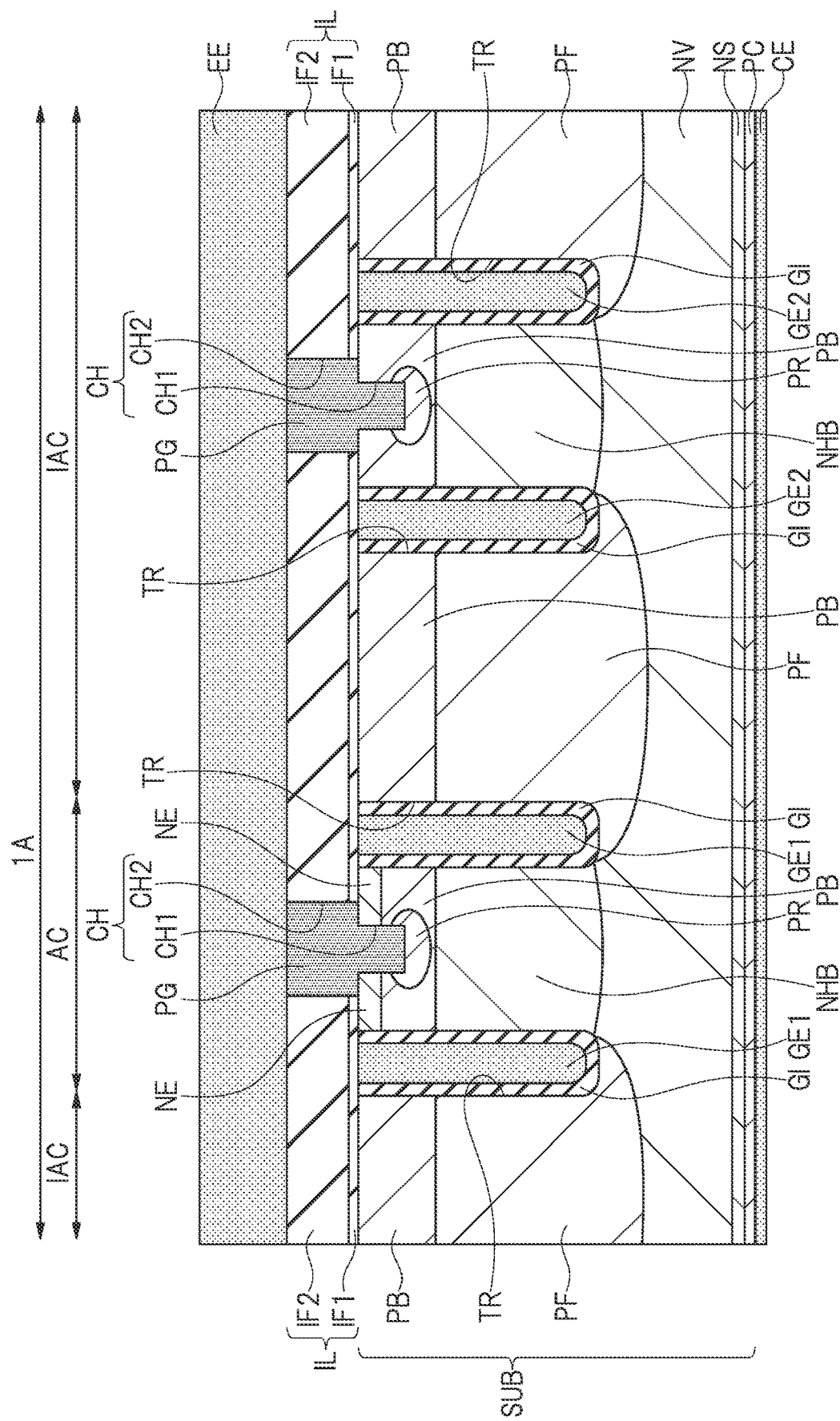
FIG. 2 is a cross-sectional view showing the semiconductor device according to the first embodiment.

FIG. 2 is a cross-sectional view corresponding to a cell region 1A shown in FIG. 1. A semiconductor element such as an IGBT is formed in the cell region 1A. The IGBT shown in FIG. 2 is an IGBT having a GGEE structure and is an IE-IGBT capable of using IE (Injection Enhancement) effect.

The IE effect is a technique for increasing the concentration of charges accumulated in a drift region NV by making it difficult to discharge holes from the side with the emitter electrode EE when the IGBT is in an ON state. Therefore, the semiconductor device 100 has an active cell AC for performing the main operation of the IGBT and an inactive cell IAC other than the active cell AC. A gate electrode GE1 of the active cell AC is electrically connected to the gate wiring GW, and a gate potential is supplied to the gate electrode GE1 during the operation of the IGBT. A gate electrode GE2 of the inactive cell IAC is electrically connected to the emitter electrode EE, and an emitter potential is supplied to the gate electrode GE2 during the operation of the IGBT.

The semiconductor device 100 includes a semiconductor substrate SUB having a low concentration n-type drift region NV. Here, the n-type semiconductor substrate SUB itself constitutes the drift region NV. Note that the drift region NV may be a stacked body of an n-type silicon substrate and a semiconductor layer grown on the silicon substrate by the epitaxial growth while introducing phosphorus (P). In the description of this application, such a stacked body is also regarded as a part of the semiconductor substrate SUB.

An n-type field stop region (impurity region) NS is formed in the semiconductor substrate SUB on a side of the back surface of the semiconductor substrate SUB. The field stop region NS is provided in order to prevent a depletion layer extending from the pn junction on a side of the front surface TS of the semiconductor substrate SUB from reaching a p-type collector region PC when turning off the IGBT.

A p-type collector region (semiconductor region) PC is formed in the semiconductor substrate SUB on a side of the back surface of the semiconductor substrate SUB. The collector region PC is located below the field stop region NS.

A collector electrode CE is formed on the back surface of the semiconductor substrate SUB. The collector electrode CE is electrically connected to the collector region PC and supplies a collector potential to the region. The collector electrode CE is made of a metal film such as an AlSi film, a Ti film, an NiV film, or an Au film.

Trenches TR are formed in the semiconductor substrate SUB on the side of the front surface of the semiconductor substrate SUB. The trenches TR penetrate an emitter region NE and/or a base region PB described later, and reach the semiconductor substrate SUB. A depth of the trench TR is, for example, 2 to 3 μm.

A gate insulating film GI is formed inside the trenches TR. The gate electrodes GE1 and GE2 are formed on the gate insulating film GI so as to fill the inside of the trenches TR. The gate insulating film GI is, for example, a silicon oxide film, and the gate electrodes GE1 and GE2 are, for example, polycrystalline silicon films into which an n-type impurity is introduced.

In the active cell AC, a hole barrier region (impurity region) NHB is formed in the semiconductor substrate SUB between the pair of gate electrodes GE1. A p-type base region (impurity region) PB is formed in the hole barrier region NHB. An n-type emitter region (impurity region) NE is formed in the p-type base region PB. A bottom portion of the base region PB is shallower than a bottom portion of the trench TR, and a bottom portion of the emitter region NE is shallower than the bottom portion of the base region PB.

In the inactive cell IAC, a hole barrier region NHB is formed in the semiconductor substrate SUB between the pair of gate electrodes GE2. Also, a p-type floating region (impurity region) PF is formed in the semiconductor substrate SUB between the gate electrode GE1 and the gate electrode GE2. A p-type base region PB is formed in the floating region PF. In order to improve high withstand voltage characteristics, the floating region PF is preferably formed to a position deeper than the bottom portion of the trench TR, and is more preferably formed so as to cover the bottom portion of the trench TR.

An interlayer insulating film IL is formed on the semiconductor substrate SUB. The interlayer insulating film IL includes an insulating film IF1 formed on the semiconductor substrate SUB and an insulating film IF2 formed on the insulating film IF1. The insulating film IF1 is a silicon oxide film. The insulating film IF2 is a silicon oxide film containing boron and phosphorus and is a BPSG (Boro Phospho Silicate Glass) film.

In the active cell AC, a contact hole CH penetrates the interlayer insulating film IL and the emitter region NE, and reaches the base region PB. The contact hole CH is formed so as to be in contact with the emitter region NE and the base region PB. A plug PG fills the inside of the contact hole CH and is electrically connected to the emitter region NE and the base region PB. The configuration of the contact hole CH and the plug PG in the inactive cell IAC is also substantially the same as that in the active cell AC except for the absence of the emitter region NE. Though not shown, the contact hole CH and the plug PG are formed also on a part of the gate electrodes GE1 and GE2.

The contact hole CH is composed of a first contact hole CH1 and a second contact hole CH2 communicating with the first contact hole CH1. The first contact hole CH1 is formed in the semiconductor substrate SUB, penetrates the emitter region NE, and reaches the base region PB. The second contact hole CH2 is formed in the insulating film IF1 and the insulating film IF2.

An opening width of the second contact hole CH2 is larger than an opening width of the first contact hole CH1. Therefore, since the aspect ratio is improved when forming the plug PG, the plug PG can be properly and easily buried inside the contact hole CH. Moreover, since the opening width of the second contact hole CH2 is large, the upper surface of the emitter region NE is also exposed. Therefore, inside the contact hole CH, the plug PG is in contact not only with the side surface of the emitter region NE but also with the upper surface of the emitter region NE. Accordingly, the contact resistance between the plug PG and the emitter region NE can be reduced.

The plug PG is composed of a stacked film of a barrier metal film and a conductive film. The barrier metal film is composed of, for example, a stacked film of a titanium film and a titanium nitride film formed on the titanium film. The conductive film is made of, for example, a tungsten film.

A p-type high concentration diffusion region (impurity region) PR is formed around a bottom portion of the first contact hole CH1. The high concentration diffusion region PR is provided in order to reduce the contact resistance with the plug PG and to prevent the latch-up.

Note that an impurity concentration of the drift region NV is $1×10^{13}$ to $2×10^{14}$ $cm^{-3}$. An impurity concentration of the field stop region NS is higher than the impurity concentration of the drift region NV and is $5×10^{16}$ to $5×10^{17}$ $cm^{-3}$. An impurity concentration of the hole barrier region NHB is higher than the impurity concentration of the drift region NV and is $1×10^{16}$ to $1×10^{17}$ $cm^{-3}$. An impurity concentration of the emitter region NE is higher than the impurity concentration of the hole barrier region NHB and is $1×10^{18}$ to $1×10^{21}$ $cm^{-3}$. An impurity concentration of the collector region PC is $1×10^{17}$ to $1×10^{21}$ $cm^{-3}$. An impurity concentration of the floating region PF is $1×10^{15}$ to $1×10^{16}$ $cm^{-3}$. An impurity concentration of the base region PB is higher than the impurity concentration of the floating region PF and is $1×10^{16}$ to $1×10^{18}$ $cm^{-3}$. An impurity concentration of the high concentration diffusion region PR is higher than the impurity concentration of the base region PB and is $1×10^{18}$ to $1×10^{21}$ $cm^{-3}$.

The emitter electrode EE is formed on the interlayer insulating film IL. The emitter electrode EE is electrically connected to the emitter region NE, the base region PB, the high concentration diffusion region PR, and the gate electrode GE2 via the plug PG, and supplies an emitter potential to these regions. Although not shown here, the gate wiring GW formed in the same step as the emitter electrode EE is also formed on the interlayer insulating film IL. The gate wiring GW is electrically connected to the gate electrode GE1 via the plug PG, and supplies a gate potential to the gate electrode GE1. The emitter electrode EE and gate wiring GW mentioned above are composed of, for example, a TiW film and an aluminum film formed on the TiW film. The aluminum film is a main conductor film of the emitter electrode EE and the gate wiring, and is sufficiently thicker than the TiW film.

<Method of Manufacturing Semiconductor Device>

The method of manufacturing the semiconductor device 100 according to the first embodiment will be described below with reference to FIG. 3 to FIG. 11.

Figure 3:
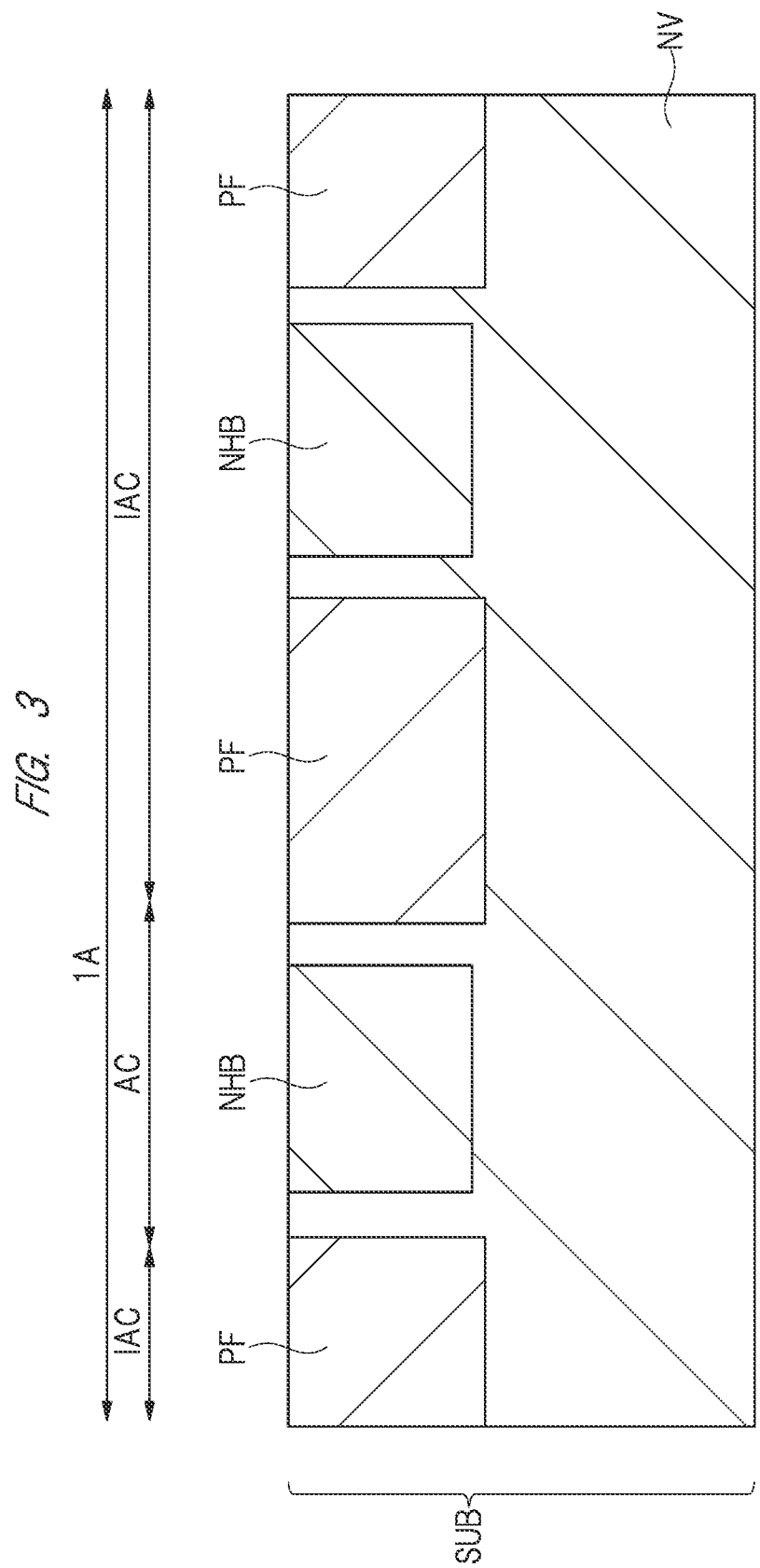
FIG. 3 is a cross-sectional view showing a manufacturing process of the semiconductor device according to the first embodiment.

As shown in FIG. 3, first, the semiconductor substrate SUB having the n-type drift region NV is prepared. Next, the n-type hole barrier region NHB and the p-type floating region PF are formed in the semiconductor substrate SUB by the photolithography method and the ion implantation method.

Figure 4:
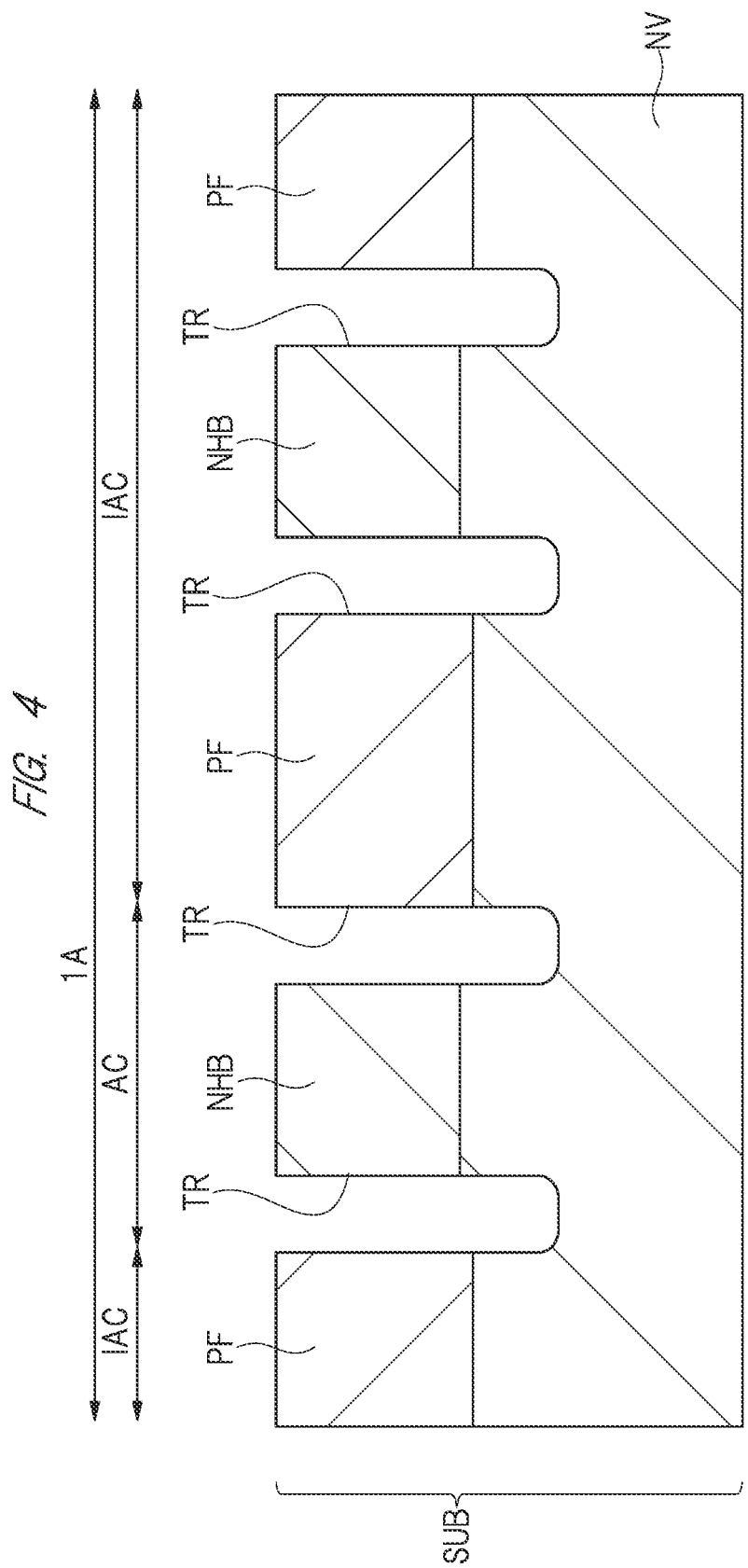
FIG. 4 is a cross-sectional view showing the manufacturing process subsequent to FIG. 3.

As shown in FIG. 4, the trenches TR are formed in the semiconductor substrate SUB. First, an insulating film made of, for example, a silicon oxide film is formed on the semiconductor substrate SUB, and the insulating film is patterned by the photolithography method and the dry etching process to form a hard mask. Next, the trenches TR are formed in the semiconductor substrate SUB by performing the anisotropic etching process using the hard mask as a mask to the semiconductor substrate SUB. Thereafter, the hard mask is removed by the wet etching process or the like.

Figure 5:
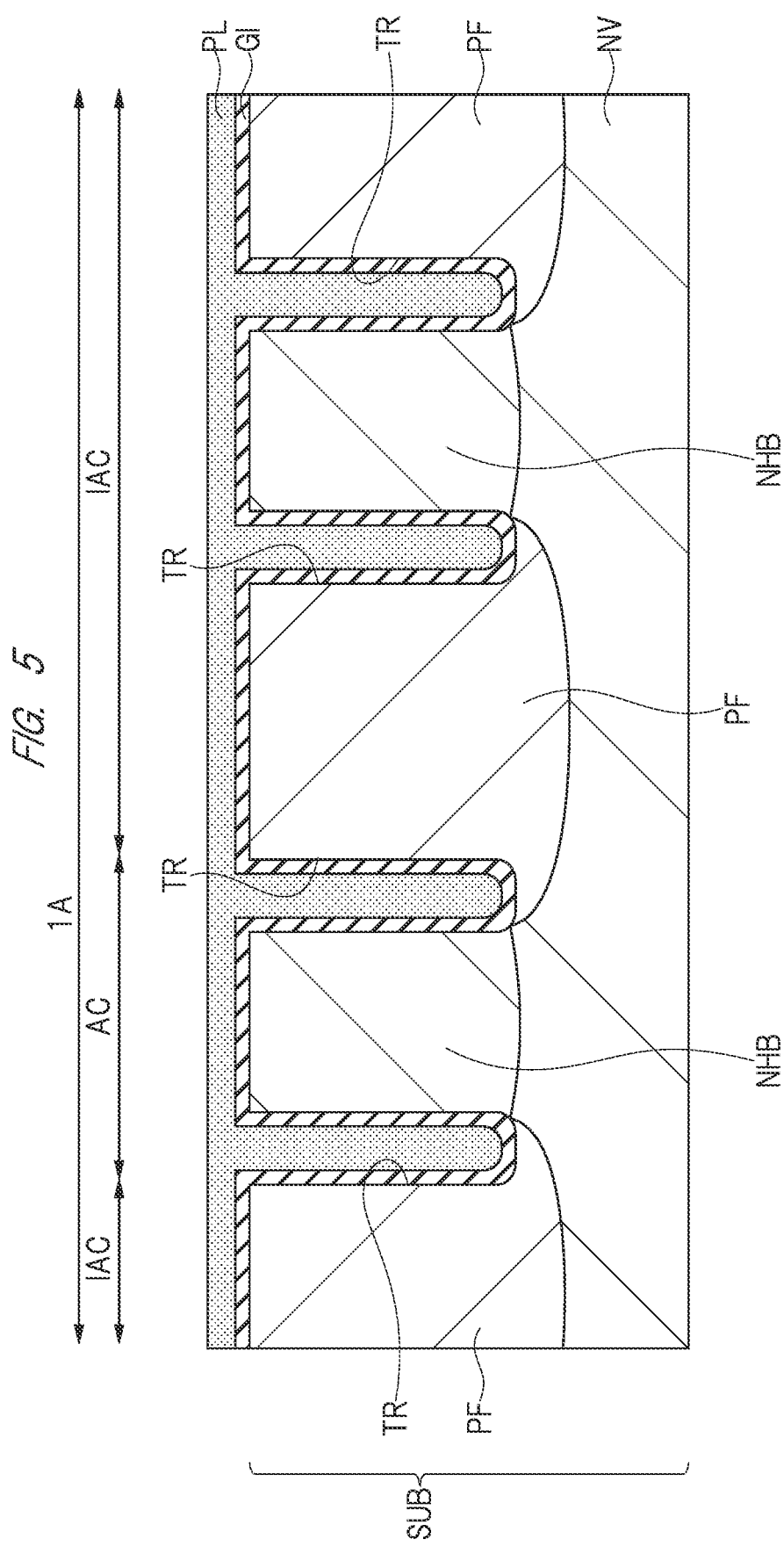
FIG. 5 is a cross-sectional view showing the manufacturing process subsequent to FIG. 4.

As shown in FIG. 5, first, by performing the heat treatment at, for example, 1000 to 1200° C. to the semiconductor substrate SUB, impurities contained in the hole barrier region NHB and the floating region PF are diffused. By this heat treatment, the hole barrier region NHB is diffused to the vicinity of the bottom portion of the trench TR, and the floating region PF is diffused to a position deeper than the bottom portion of the trench TR so as to cover the bottom portion of the trench TR.

Next, the gate insulating film GI is formed inside the trenches TR and on the semiconductor substrate SUB. The gate insulating film GI is formed by the thermal oxidation process (wet oxidation process) using water vapor in an atmosphere at 950° C. A thickness of the gate insulating film GI is, for example, 1000 angstroms (Å). Next, a conductive film PL such as a polycrystalline silicon film into which an n-type impurity is introduced is formed on the gate insulating film GI by, for example, the CVD method so as to fill the inside of the trenches TR.

Figure 6:
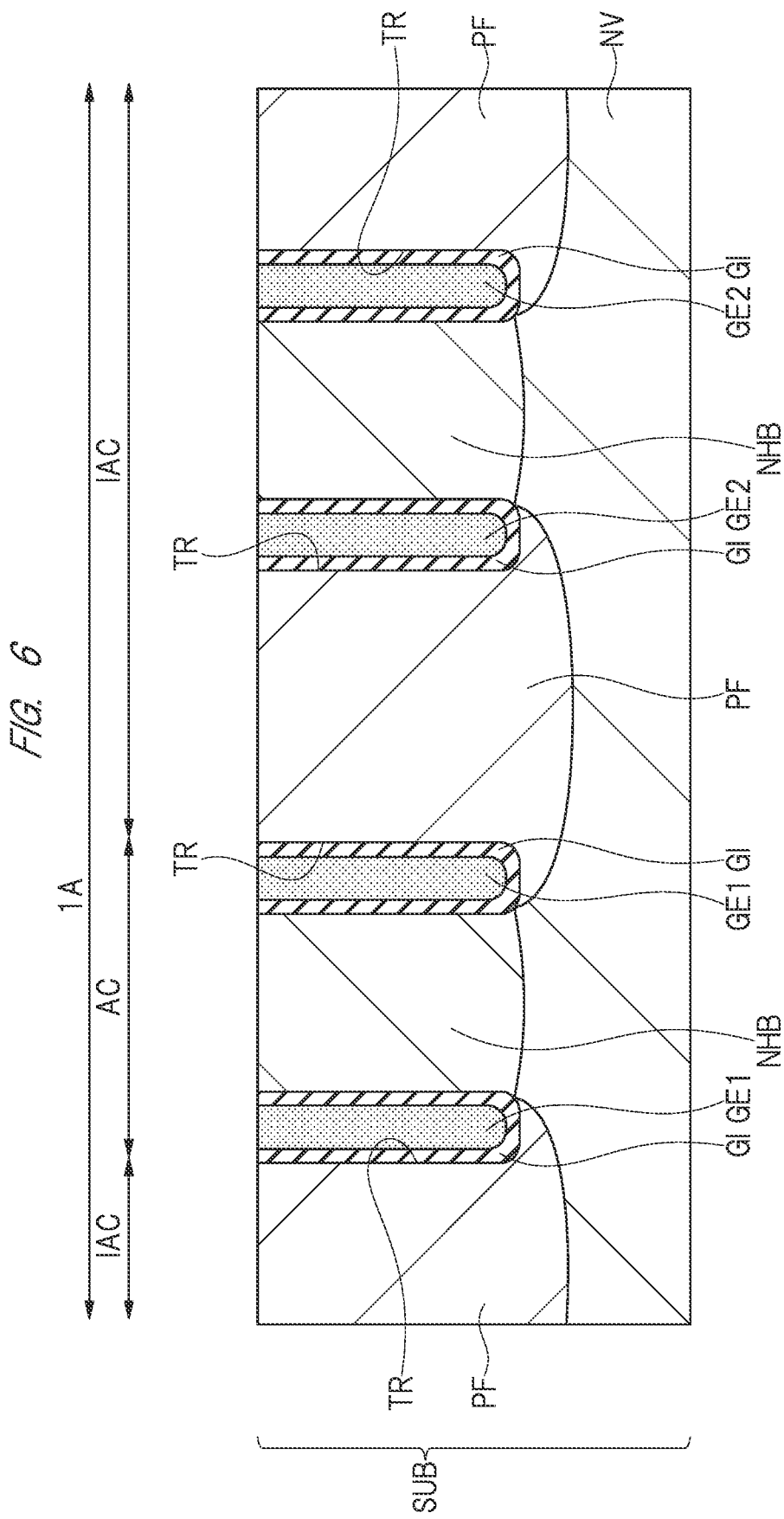
FIG. 6 is a cross-sectional view showing the manufacturing process subsequent to FIG. 5.

As shown in FIG. 6, first, the conductive film PL formed outside the trenches TR is removed by the dry etching process. The conductive film PL formed inside the trenches TR is left as the gate electrodes GE1 and GE2. Next, the gate insulating film GI formed outside the trenches TR is removed by the anisotropic etching process and the isotropic etching process.

Figure 7:
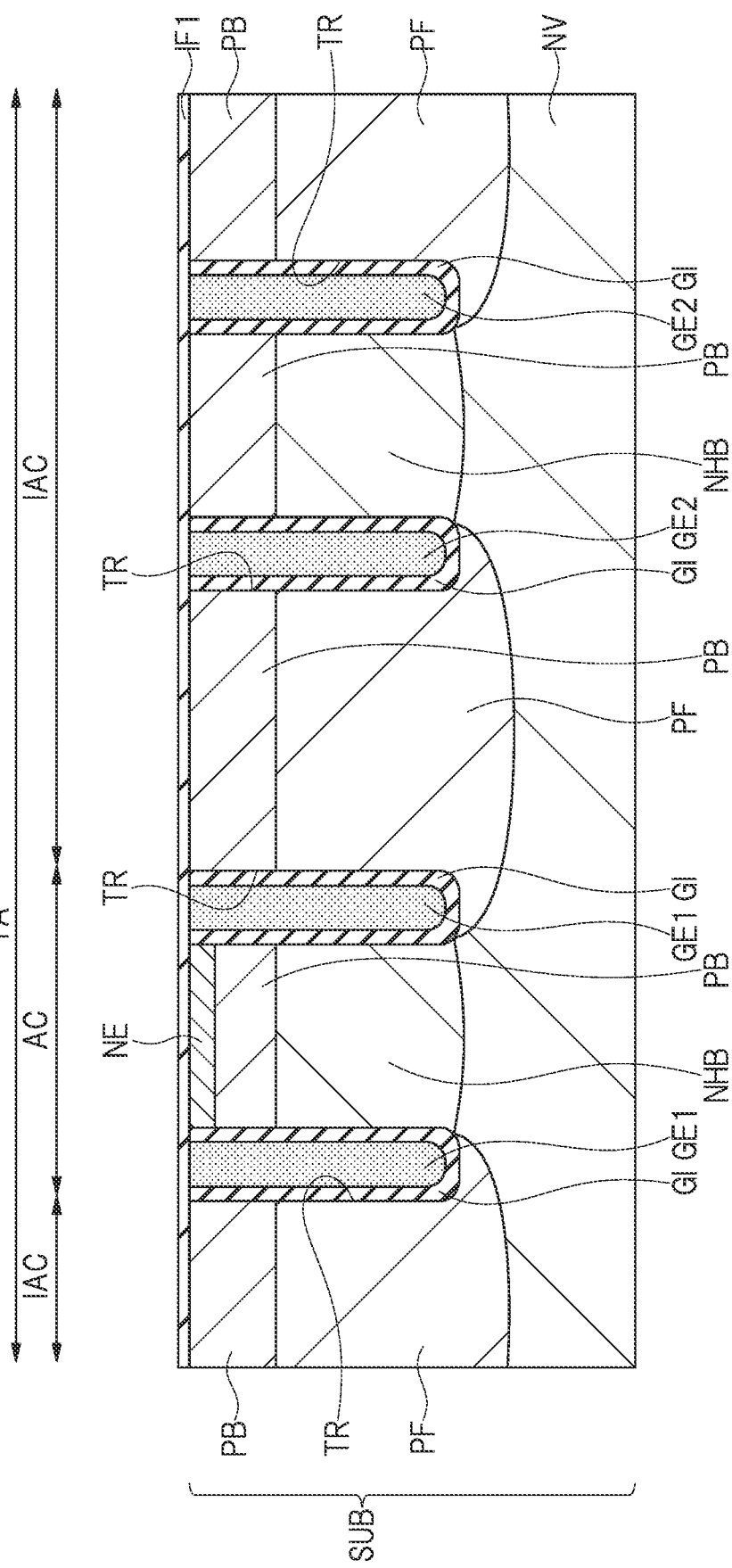
FIG. 7 is a cross-sectional view showing the manufacturing process subsequent to FIG. 6.

As shown in FIG. 7, the insulating film IF1 made of a silicon oxide film is formed on the semiconductor substrate SUB. The insulating film IF1 is formed by the thermal oxidation process (dry oxidation process) using oxygen gas in an atmosphere at 950° C. A thickness of the insulating film IF1 is, for example, 200 to 500 angstroms (Å).

Next, the p-type base region PB is formed in the semiconductor substrate SUB (floating region PF and hole barrier region NHB) by the photolithography method and the ion implantation method using the insulating film IF1 as a through film. Next, the n-type emitter region NE is formed in the base region PB of the active cell AC by the photolithography method and the ion implantation method. Thereafter, for example, heat treatment is performed at 950° C. for 30 seconds to activate the impurities contained in each impurity region.

Figure 8:
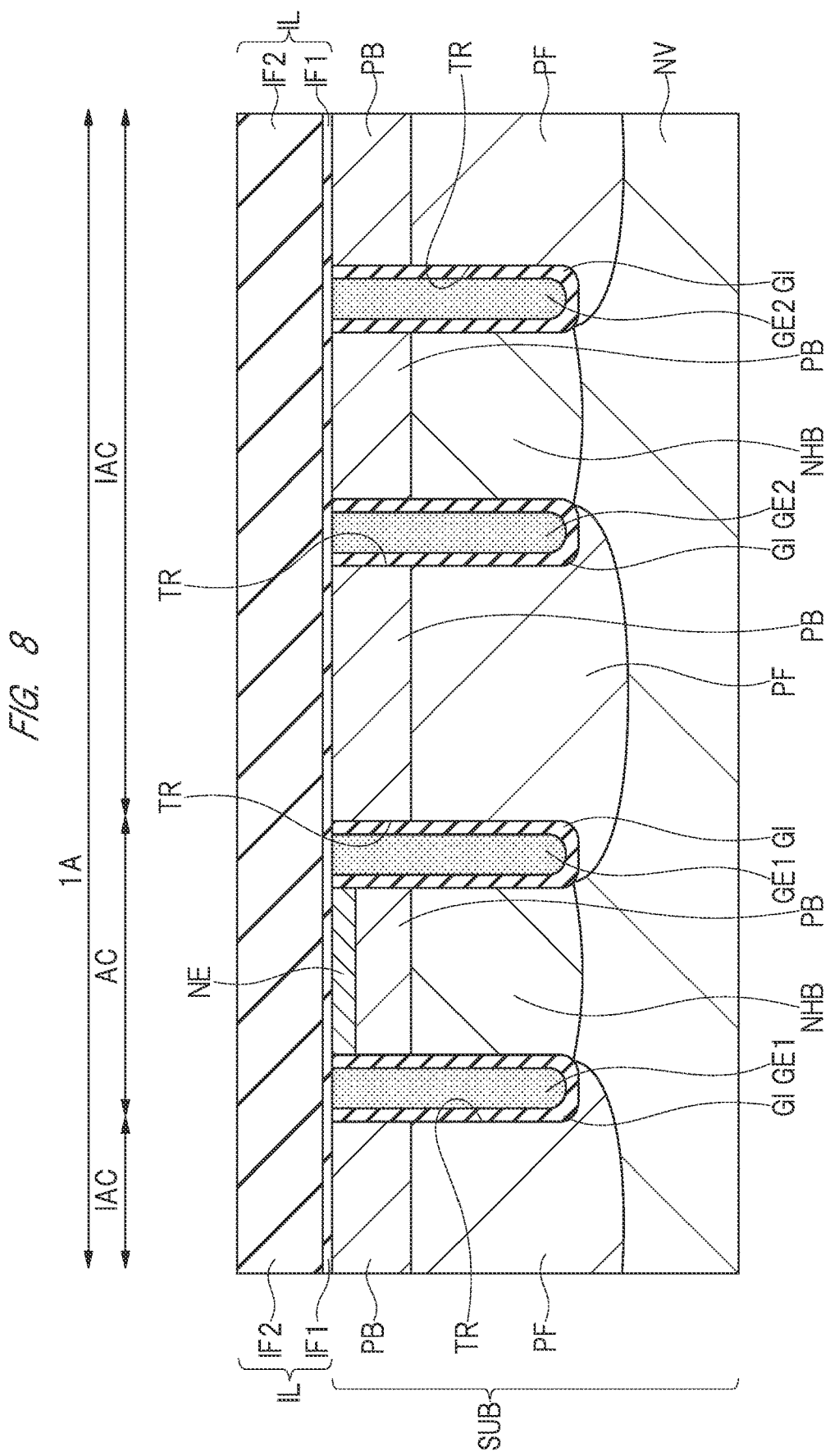
FIG. 8 is a cross-sectional view showing the manufacturing process subsequent to FIG. 7.

As shown in FIG. 8, the insulating film IF2 is formed on the insulating film IF1 by, for example, the CVD method. The insulating film IF2 is a silicon oxide film containing boron and phosphorus, and is a BPSG film. The insulating film IF1 and the insulating film IF2 each constitute a part of the interlayer insulating film IL. A thickness of the insulating film IF2 is larger than the thickness of the insulating film IF1, and is, for example, 1000 nm. Next, heat treatment (reflow process) is performed to the insulating film IF2 at, for example, 950° C. for 30 minutes. By this reflow process, the insulating film IF2 is softened and the upper surface of the insulating film IF2 is planarized.

Figure 9:
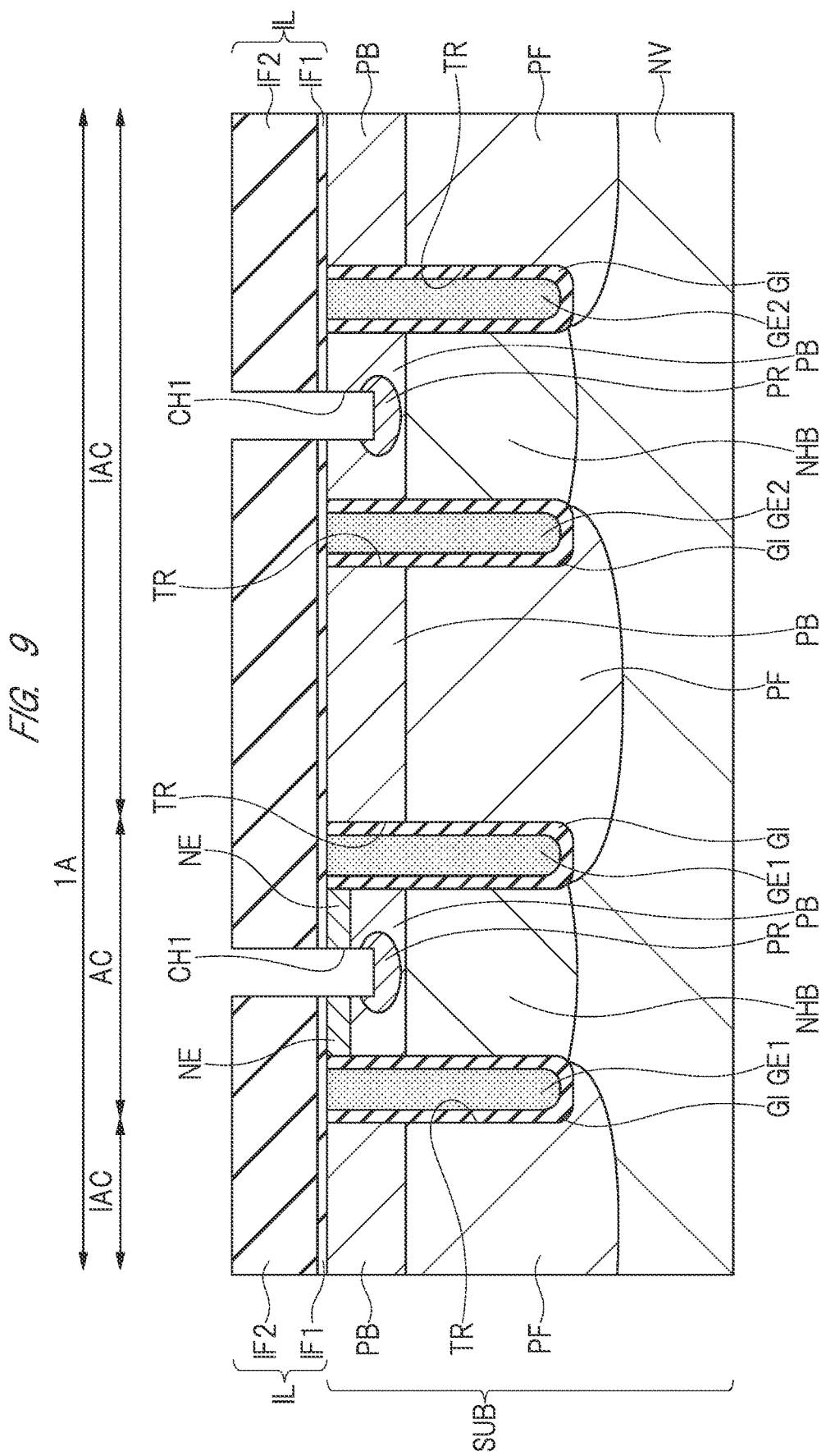
FIG. 9 is a cross-sectional view showing the manufacturing process subsequent to FIG. 8.

As shown in FIG. 9, the first contact holes CH1 are formed in the insulating film IF2, the insulating film IF1, the emitter region NE, and the base region PB by the photolithography method and the dry etching process. The bottom portion of the first contact hole CH1 is located in the base region PB.

Next, the p-type high concentration diffusion region PR is formed at the bottom portion of the first contact hole CH1 by the photolithography method and the ion implantation method. Thereafter, heat treatment for activating each impurity region is performed. The ion implantation of the high concentration diffusion region PR is performed in two steps. Boron is used for the first ion implantation, and the ion implantation is performed under the conditions of an energy of 60 keV and a dose amount of $3\times10^{15}$ cm$^2$. Boron difluoride is used for the second ion implantation, and the ion implantation is performed under the conditions of an energy of 80 keV and a dose amount of $5\times10^{15}$ cm$^2$. Thereafter, for example, heat treatment is performed at 950° C. for 30 seconds to activate the impurities contained in each impurity region.

Figure 10:
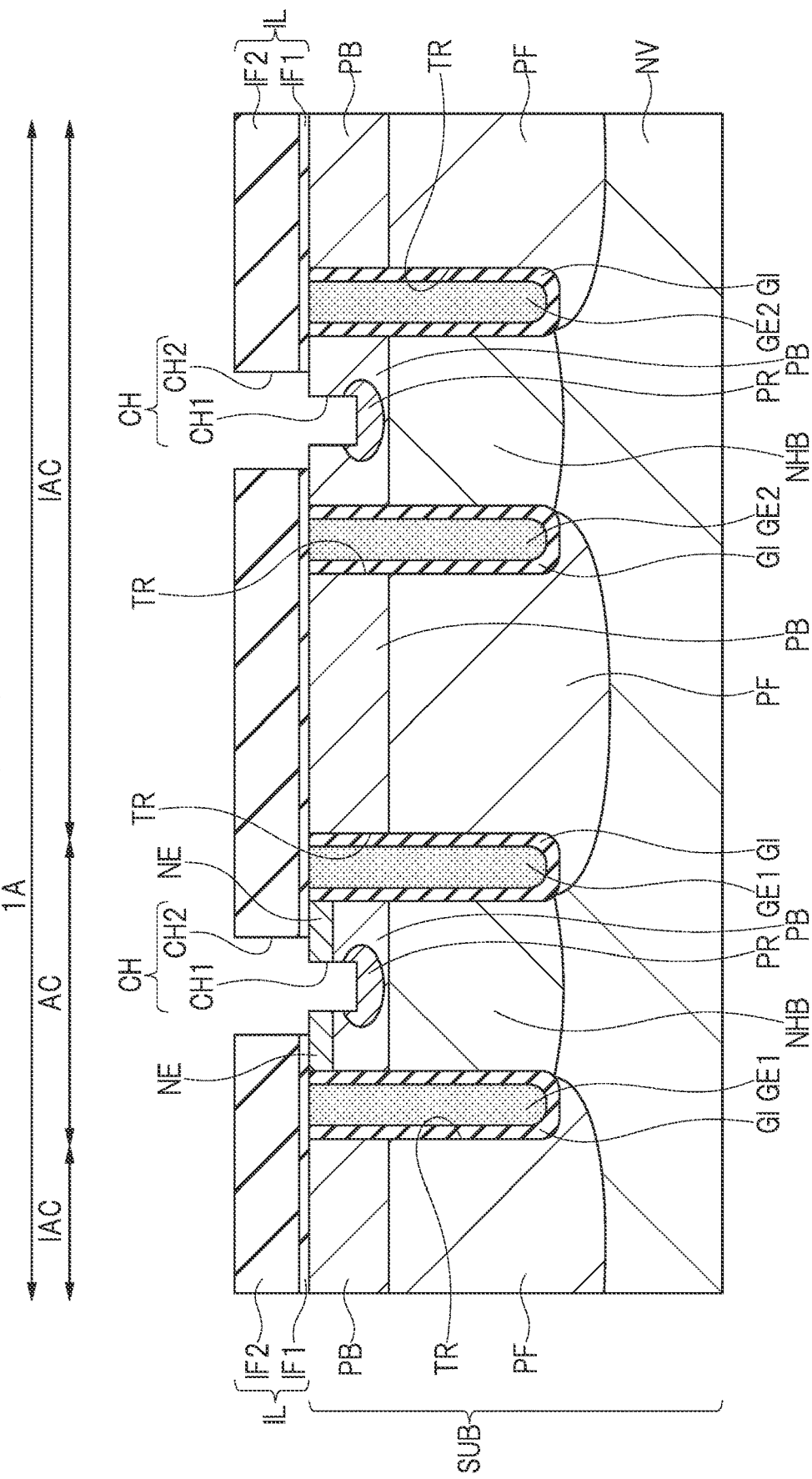
FIG. 10 is a cross-sectional view showing the manufacturing process subsequent to FIG. 9.

As shown in FIG. 10, the insulating film IF2 and the insulating film IF1 are recessed by performing the isotropic etching process to the insulating film IF2 and the insulating film IF1. For example, an aqueous solution containing hydrofluoric acid is used for this isotropic etching process. In this way, the second contact holes CH2 are formed in the insulating film IF2 and the insulating film IF1. The opening width of the second contact hole CH2 is larger than the opening width of the first contact hole CH1. Note that the recessed amount of the insulating film IF2 and the insulating film IF1 by the isotropic etching process is about 130 nm.

Figure 11:
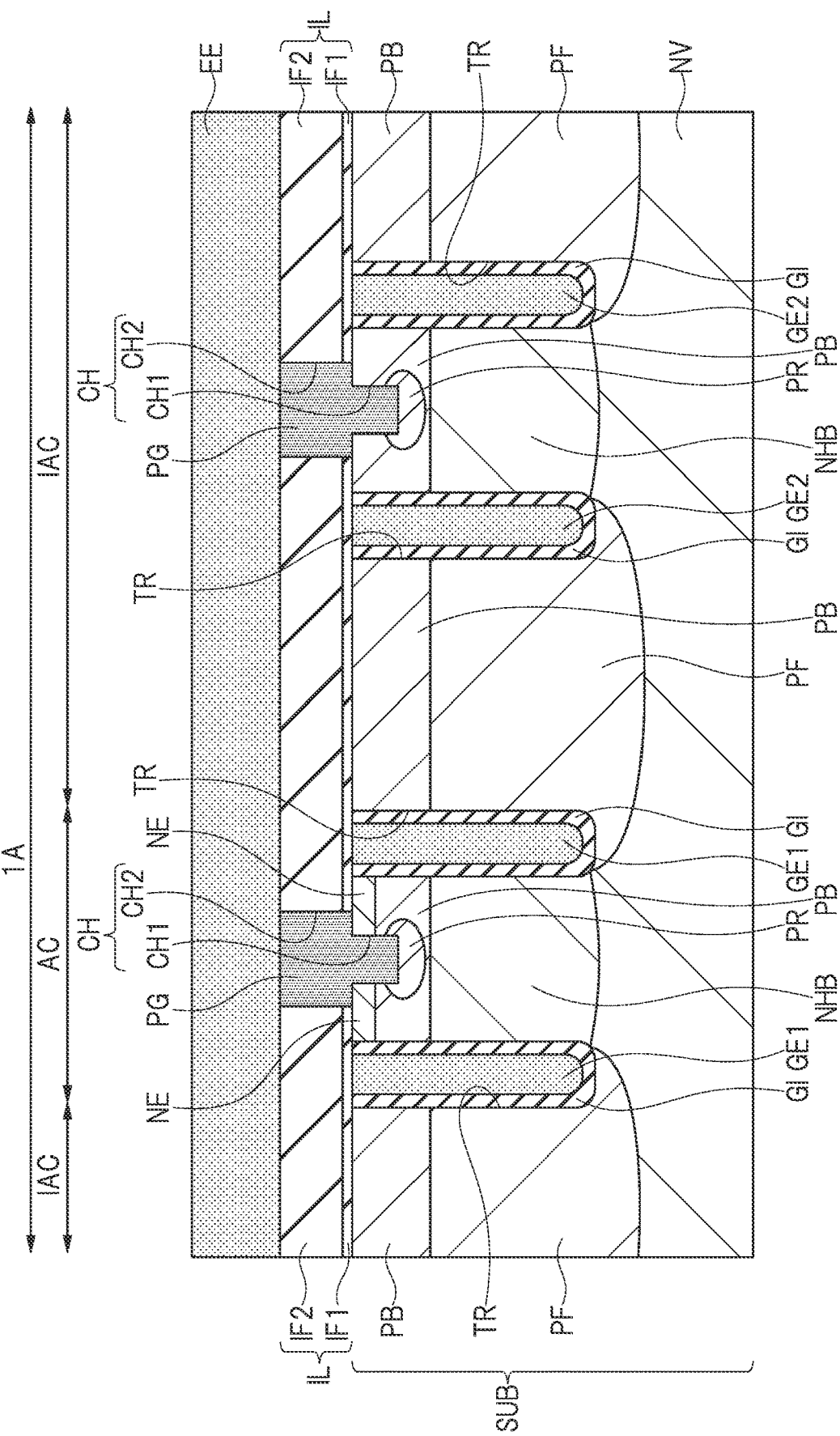
FIG. 11 is a cross-sectional view showing the manufacturing process subsequent to FIG. 10.

As shown in FIG. 11, the plugs PG are formed inside the contact holes CH. First, a barrier metal film is formed by forming a titanium film inside the contact holes CH and on the interlayer insulating film IL by, for example, the sputtering method and then forming a titanium nitride film on the titanium film by, for example, the sputtering method. Next, a tungsten film is formed on the barrier metal film by, for example, the CVD method so as to fill the inside of the contact holes CH. Next, the tungsten film and the barrier metal film formed outside the contact holes CH are removed by the dry etching process. In this way, the plugs PG which are embedded in the contact holes CH and electrically connected to the emitter region NE and the base region PB are formed.

Next, the emitter electrode EE is formed on the interlayer insulating film IL. First, a TiW film is formed on the interlayer insulating film IL by, for example, the sputtering method, and an aluminum film is formed on the TiW film by, for example, the sputtering method. Next, the emitter electrode EE is formed by patterning the TiW film and the aluminum film by the photolithography method and the dry etching process. Although not shown here, the gate wiring GW is also formed in the same step as the step of forming the emitter electrode EE.

After forming the metal film by the sputtering method, hydrogen annealing process is performed in order to form a metal alloy. For example, the hydrogen annealing process is performed in a hydrogen atmosphere at 400 to 600° C. for 30 minutes.

Thereafter, the field stop region NS, the collector region PC, and the collector electrode CE are formed on a side of the back surface of the semiconductor substrate SUB, so that the structure shown in FIG. 2 can be obtained.

First, the n-type field stop region NS and the p-type collector region PC are formed by performing ion implantation from the side of the back surface of the semiconductor substrate SUB. The ion implantation of the field stop region NS is performed using phosphorus under the conditions of an energy of 700 to 1600 keV and a dose amount of $2\times10^{12}$ cm$^2$. The ion implantation of the collector region PC is performed using boron under the conditions of an energy of 60 keV and a dose amount of $2\times10^{13}$ cm$^2$. Further, after these ion implantations, laser annealing is performed to activate the impurities contained in the field stop region NS and the collector region PC.

Next, a metal film such as an AlSi film, a Ti film, an NiV film, or an Au film is formed on the collector region PC exposed on the side of the back surface of the semiconductor substrate SUB by, for example, the sputtering method. This metal film becomes the collector electrode CE.

Through the process described above, the semiconductor device 100 according to the first embodiment is manufactured.

<Studies by Inventors>

As described above, since the gate insulating film GI has a relatively large thickness, variations in the thickness of the gate insulating film GI are likely to occur when forming the gate insulating film GI and during the dry etching process of the conductive film PL. Therefore, the insulating film IF1 having a uniform and small thickness is re-formed, and the insulating film IF1 is used as the through film for ion implantation.

Also, wet oxidation process is used to form the gate insulating film GI, and dry oxidation process is used to form the insulating film IF1. In the wet oxidation process, the solubility of water vapor is high and the diffusion rate of $H_2O$ molecules is high, and thus the oxidation rate is faster than that in the dry oxidation process. Although the dry oxidation process has a slow oxidation rate, the dry oxidation process is suitably used for forming the insulating film IF1 in terms of forming a film with a uniform thickness.

Studies by the inventors of this application have revealed that, when the dry oxidation process is performed, the interface state increases and hydrogen ions are formed, so that the PBTI is deteriorated. Originally, the interface state is a state in which the SiH junction at the interface is broken. Since the wet oxidation process is performed in an $H_2O$ atmosphere, the interface state is rejoined with hydrogen in $H_2O$, and the SiH junction tends to be regenerated. Therefore, it is presumed that the wet oxidation process is likely to reduce the interface state. On the other hand, since the dry oxidation process is performed in an oxygen gas atmosphere, the SiH junction is less likely to be regenerated. Therefore, it is presumed that the dry oxidation process is less likely to reduce the interface state.

In addition, the hydrogen annealing process is used to form the metal alloy, and it is presumed that hydrogen ions are formed by the combination with the reoxidation process (dry oxidation process).

Figure 12:
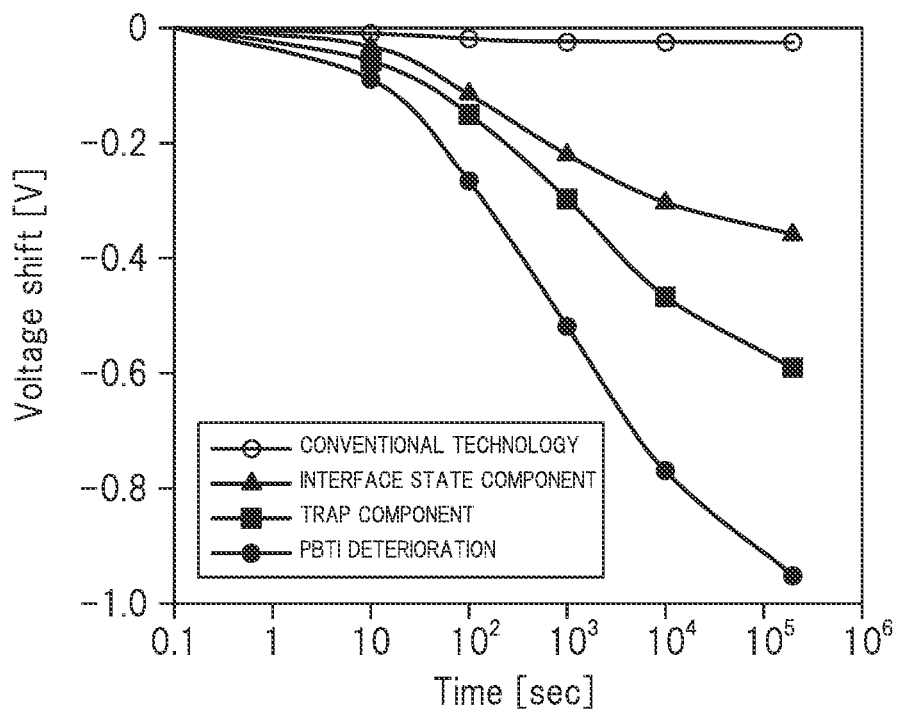
FIG. 12 is a graph showing the results of analysis of the deterioration of PBTI in a studied example.
Figure 13:
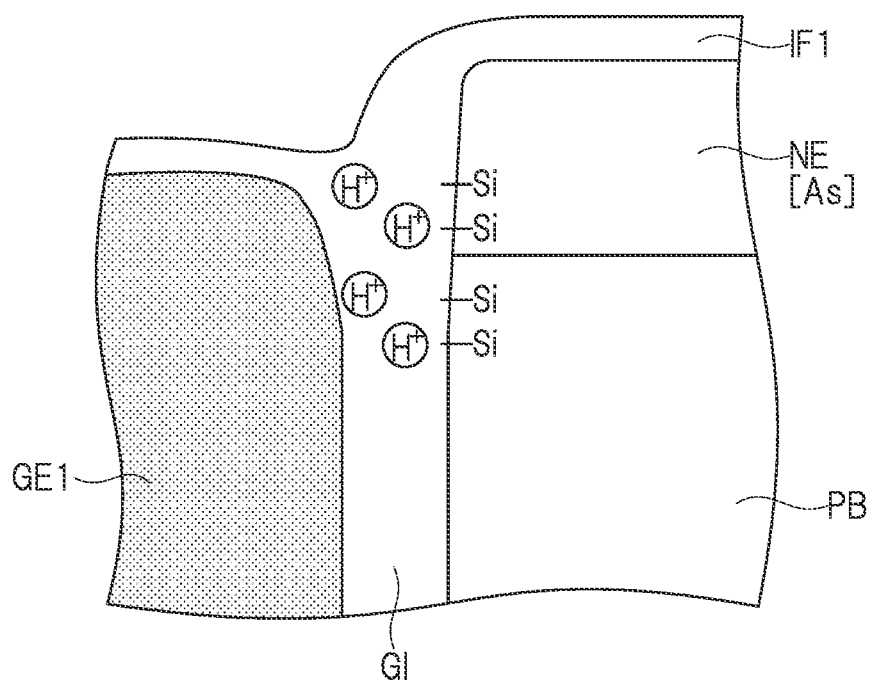
FIG. 13 is a schematic diagram showing a model of the deterioration of PBTI in the studied example.

FIG. 12 is a graph showing the results of analysis of the deterioration of PBTI in the studied example. FIG. 13 is a schematic diagram showing a model of the deterioration of PBTI in the studied example.

The conventional technology (○) shown in FIG. 12 uses the gate insulating film GI as a through film for ion implantation without performing the removal of the gate insulating film GI and the dry oxidation process. Note that the emitter region NE in the studied example is formed shallower than the emitter region NE of the first embodiment. The ion implantation for forming the emitter region NE in the studied example is performed using arsenic under the conditions of an energy of 100 keV and a dose amount of $1\times10^{15}$ to $5\times10^{15}$ cm$^2$.

As shown in FIG. 12, in the studied example, the threshold voltage fluctuates over time due to the deterioration of PBTI (●). The inventors of this application have clarified using the component separation method that the deterioration of PBTI (●) includes an interface state component (▲) and a trap component (■) due to hydrogen ions in the gate insulating film.

Hydrogen ions that have been diffused by PBTI stress terminate the interface state and the threshold voltage decreases. On the other hand, it is presumed that, when hydrogen ions which are positive charges approach the interface between the gate insulating film GI and the base region PB, the hydrogen ions function as traps in the film and the threshold voltage decreases. In other words, if a portion where an interface state is present and a portion where hydrogen ions are distributed are used as a channel region, the fluctuation of the threshold voltage occurs.

Main Feature of First Embodiment

The main feature of the first embodiment will be described below with reference to FIG. 14 to FIG. 21. FIG. 14 to FIG. 19 are enlarged cross-sectional views showing details of the manufacturing process described with reference to FIG. 6 and FIG. 7.

Figure 14:
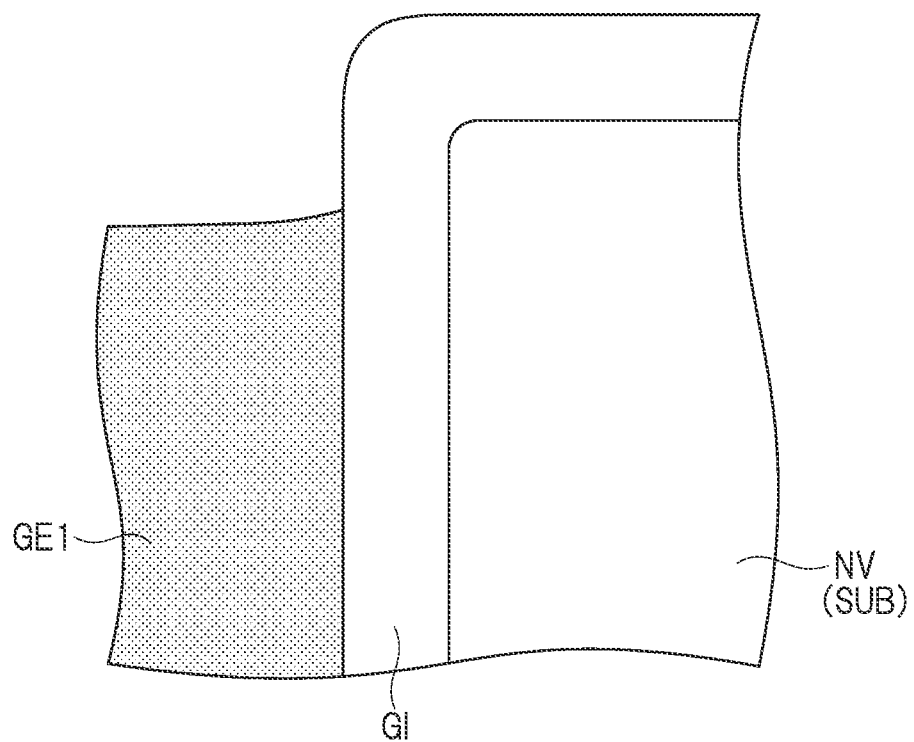
FIG. 14 is an enlarged cross-sectional view showing details of the manufacturing process in FIG. 6 and FIG. 7.

FIG. 14 shows a state in which the gate insulating film GI and the conductive film PL are formed, and then the conductive film PL formed outside the trench TR is removed to form the gate electrode GE1. Although the periphery of the gate electrode GE1 will be described here, the same process is performed also in the periphery of the gate electrode GE2 except for the formation of the emitter region NE.

Figure 15:
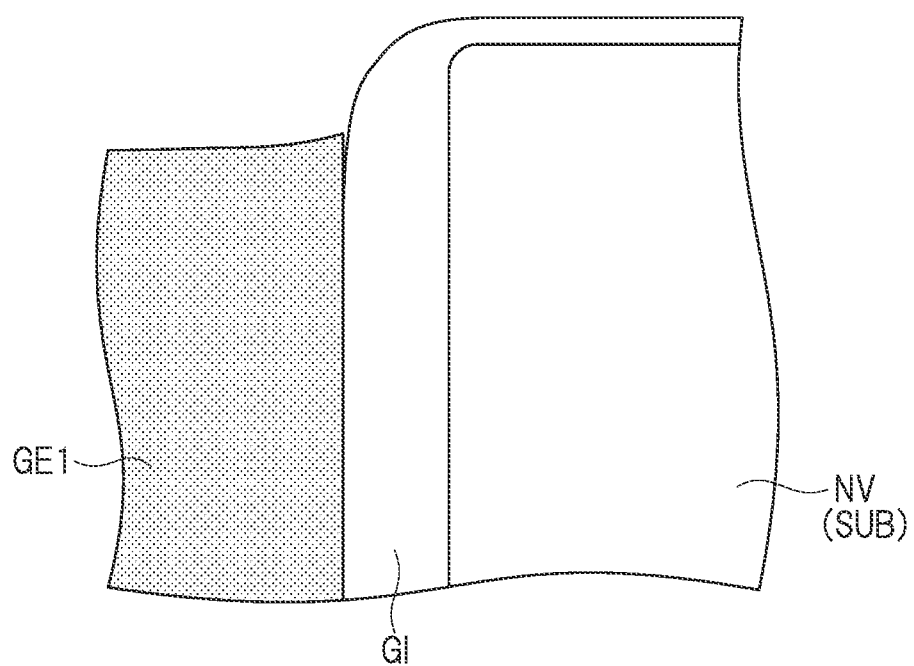
FIG. 15 is an enlarged cross-sectional view showing the manufacturing process subsequent to FIG. 14.

As shown in FIG. 15, the thickness of the gate insulating film GI is reduced by performing the anisotropic etching process. The etching progresses rapidly on the semiconductor substrate SUB and the thickness of the gate insulating film GI is easily reduced, but the gate insulating film GI inside the trench TR is not etched so much. Here, if trying to remove all the gate insulating film GI on the semiconductor substrate SUB by the anisotropic etching process, etching damage occurs in the semiconductor substrate SUB during overetching. Therefore, most of the gate insulating film GI is removed by the anisotropic etching process, and the remaining gate insulating film GI is removed by the isotropic etching process.

Figure 16:
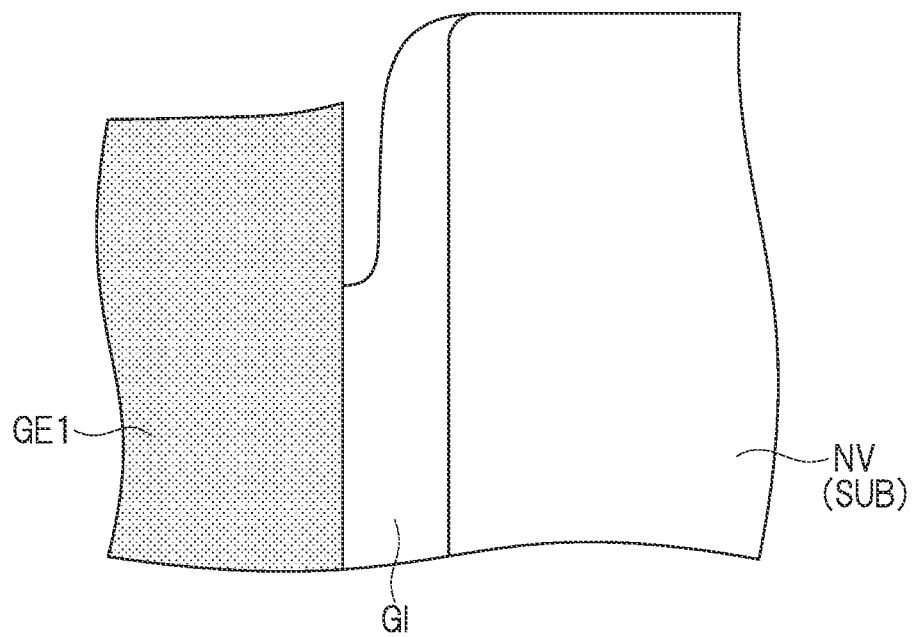
FIG. 16 is an enlarged cross-sectional view showing the manufacturing process subsequent to FIG. 15.

As shown in FIG. 16, the gate insulating film GI formed outside the trench TR is removed by performing the isotropic etching process. At this time, since the etching progresses also from the upper side of the gate electrode GE1, a part of the gate insulating film GI in contact with the side surface of the gate electrode GE1 inside the trench TR is also removed. As a result, a part of the side surface of the gate electrode GE1 is exposed. Namely, the upper portion of the gate electrode GE1 is exposed.

Figure 17:
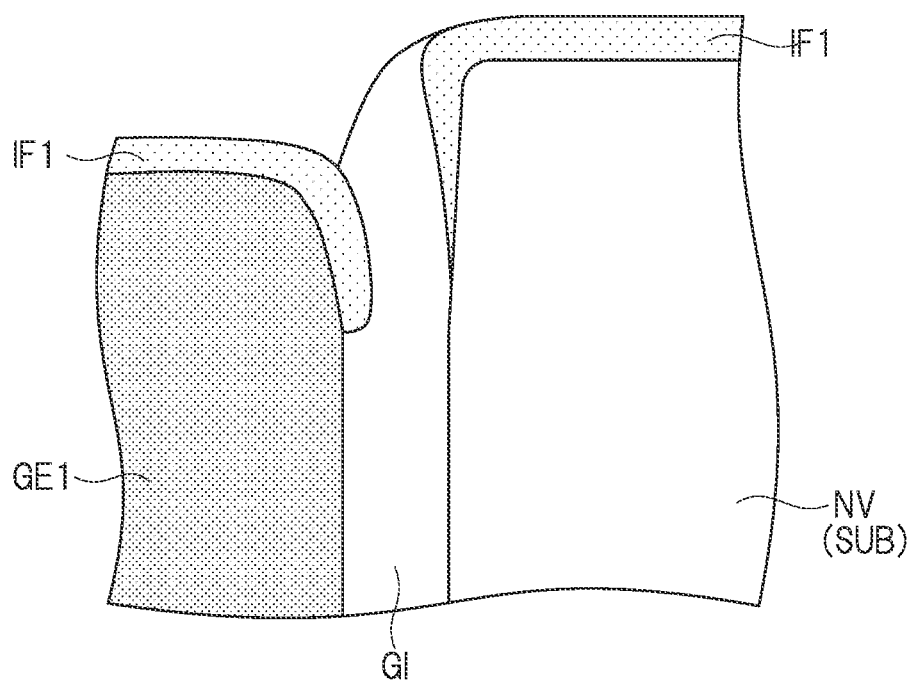
FIG. 17 is an enlarged cross-sectional view showing the manufacturing process subsequent to FIG. 16.

As shown in FIG. 17, the insulating film IF1 made of a silicon oxide film is formed on the semiconductor substrate SUB. The insulating film IF1 is formed by the thermal oxidation process (dry oxidation process) using oxygen gas in an atmosphere at 950° C. Further, the thickness of the insulating film IF1 formed on the semiconductor substrate SUB is smaller than the thickness of the gate insulating film GI formed on the semiconductor substrate SUB in FIG. 14, is equal to or smaller than half the thickness of the gate insulating film GI, and is, for example, 200 to 500 angstroms (Å).

By the dry oxidation process, the insulating film IF1 is formed also between the side surface of the trench TR and the gate insulating film GI like a bird's beak. Further, the insulating film IF1 is formed also on the part of the exposed side surface of the gate electrode GE1. Namely, the upper portion of the gate electrode GE1 is oxidized, and the corner portion formed by the upper surface of the gate electrode GE1 and the side surface of the gate electrode GE1 is oxidized. Although the gate insulating film GI and the insulating film IF1 are integrated, they are illustrated separately here for easier understanding of the description.

Figure 18:
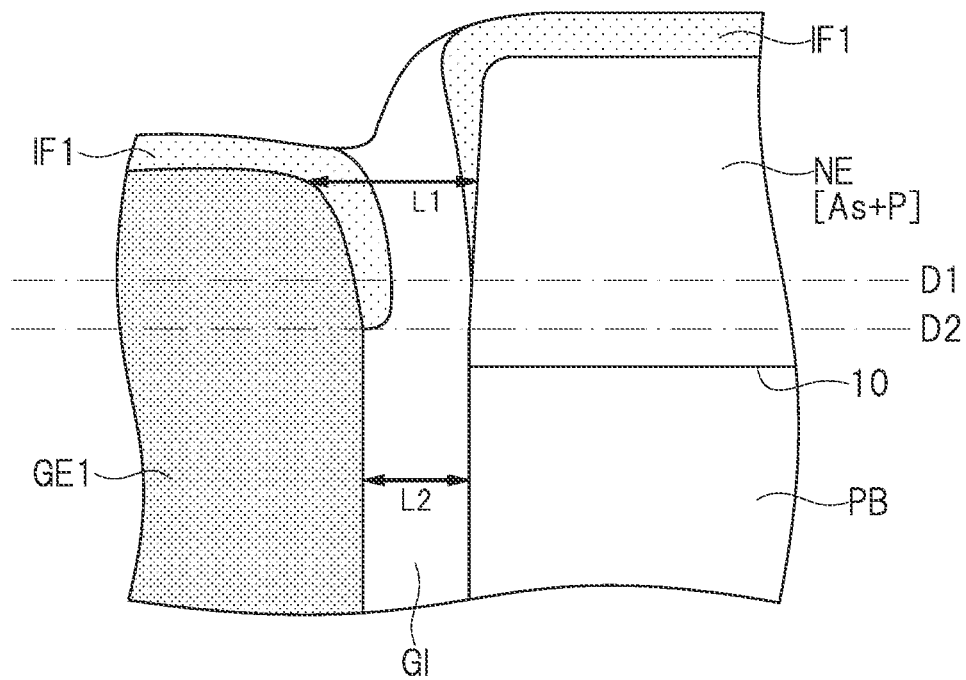
FIG. 18 is an enlarged cross-sectional view showing a depth relationship of respective components.

Next, as shown in FIG. 18, the base region PB is formed in the semiconductor substrate SUB and the emitter region NE is formed in the base region PB by the photolithography method and the ion implantation method. These ion implantations are performed using the insulating film IF1 as a through film. The ion implantation of the base region PB is performed using boron under the conditions of an energy of 110 keV and a dose amount of $1 \times 10^{13}$ to $2 \times 10^{13}$ cm$^2$. Thereafter, heat treatment is performed at, for example, 1000° C. for 100 to 200 minutes to diffuse the impurity contained in the base region PB.

The ion implantation of the emitter region NE is performed in two steps. Arsenic is used for the first ion implantation, and the ion implantation is performed under the conditions of an energy of 100 keV and a dose amount of $1 \times 10^{15}$ to $5 \times 10^{15}$ cm$^2$. Phosphorus is used for the second ion implantation, and the ion implantation is performed under the conditions of an energy of 70 keV and a dose amount of $1 \times 10^{14}$ to $1 \times 10^{15}$ cm$^2$.

In the studied example, the ion implantation of the emitter region NE is performed in one step, and arsenic is used for the ion implantation. In the first embodiment, the emitter region NE is formed by ion-implanting both arsenic and phosphorus. Therefore, the emitter region NE in the first embodiment is formed deeper than the emitter region NE in the studied example. For example, a boundary 10 between the base region PB and the emitter region NE is located at a position of 300 nm or more and 500 nm or less from the upper surface of the semiconductor substrate SUB.

Figure 19:
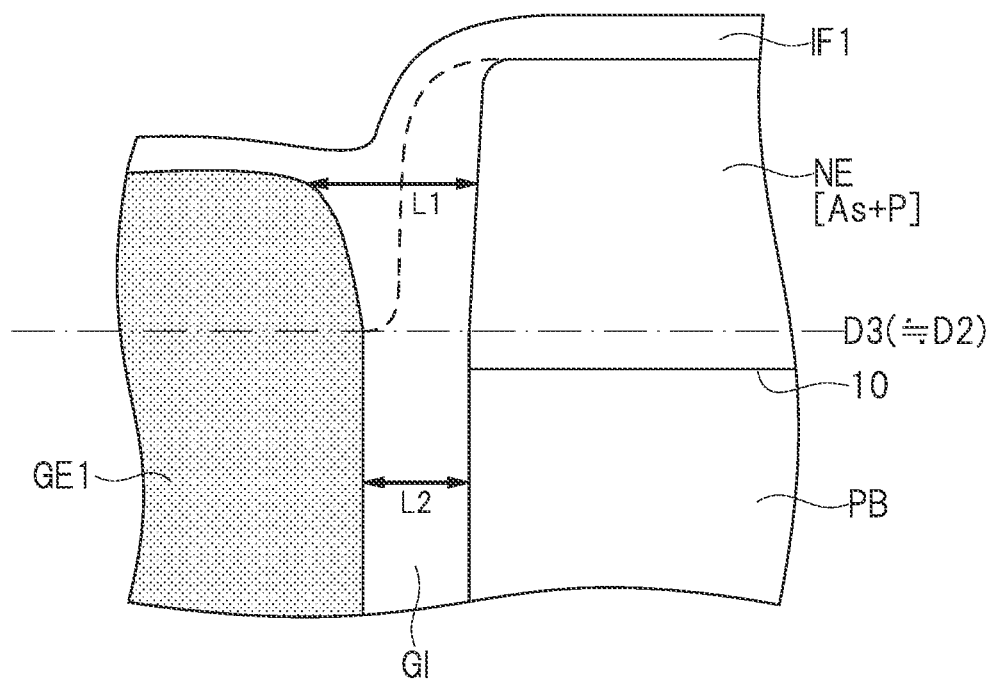
FIG. 19 is an enlarged cross-sectional view showing a depth relationship of respective components.

A reference character D1 denotes the depth position of the insulating film IF1 formed between the side surface of the trench TR and the gate insulating film GI. A reference character D2 denotes the depth position of the insulating film IF1 formed on a part of the side surface of the gate electrode GE1. The boundary 10 is located at a position deeper than the depths D1 and D2 of the insulating films IF1. In addition, as shown in FIG. 19, the boundary 10 is located at a position deeper than the part of the side surface of the gate electrode GE1 exposed in FIG. 16 (depth D3). Note that the depth D3 is substantially the same as the depth D2.

Locating the boundary 10 at the position deeper than the insulating film IF1 can be restated as follows. As shown in FIG. 18 and FIG. 19, the distance L1 between the gate electrode GE1 and the emitter region NE above the boundary 10 becomes larger than the distance L2 between the gate electrode GE1 and the base region PB below the boundary 10 by the dry oxidation process. In addition, the distance L1 becomes longer as it gets closer to the upper surface of the gate electrode GE1. In other words, above the boundary 10, the width of the gate electrode GE1 becomes narrower as it gets closer to the upper surface of the gate electrode GE1. The difference between the distance L1 at the position of the upper surface of the gate electrode GE1 and the distance L2 is 30 nm or more and 100 nm or less.

Figure 20:
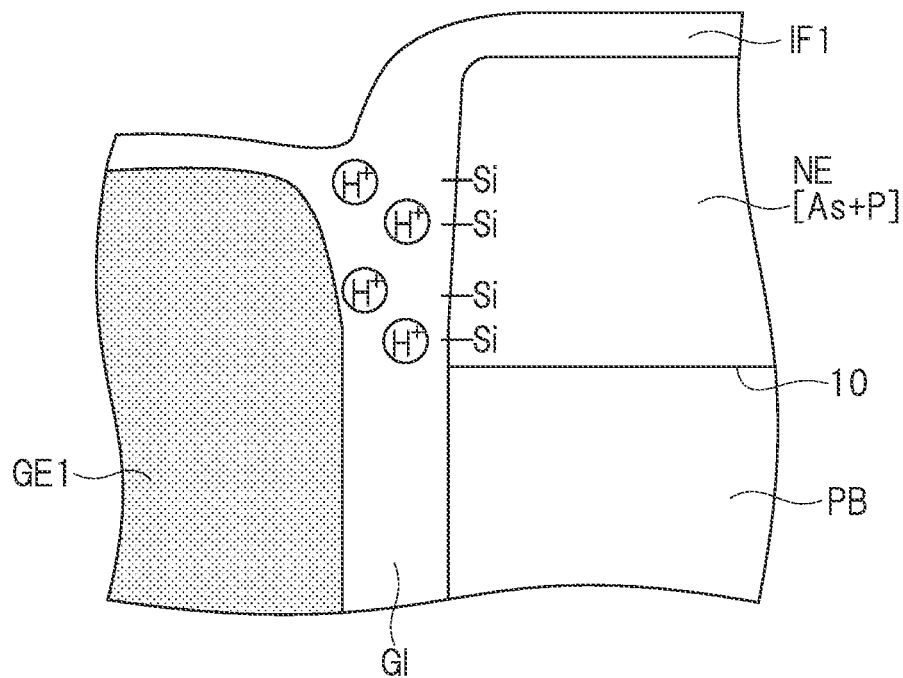
FIG. 20 is a schematic diagram showing a model of the improvement of PBTI in the first embodiment.

By making the position of the boundary 10 deep in this way, as shown in FIG. 20, the portion where the threshold voltage is likely to fluctuate due to the deterioration of PBTI is not used as the channel region, and the portion having less deterioration of PBTI can be used for the channel region. Therefore, the reliability of the semiconductor device 100 can be improved.

Figure 21:
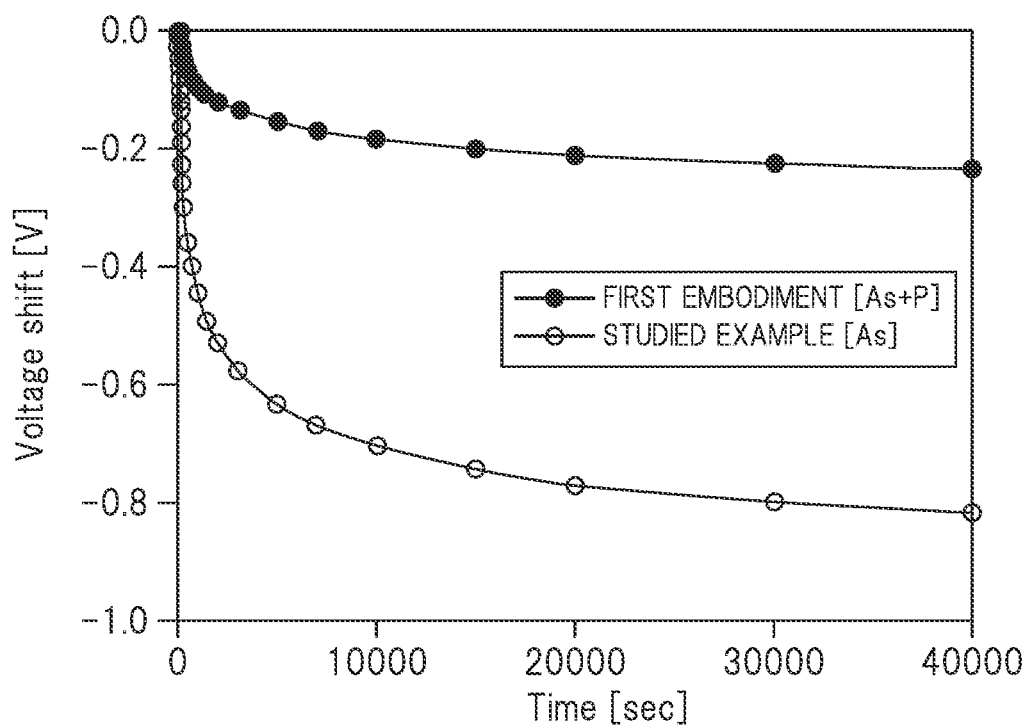
FIG. 21 is a graph showing the fluctuation of the threshold voltage in the studied example and the first embodiment.

FIG. 21 is a graph showing the fluctuation of the threshold voltage in the studied example and the first embodiment. It can be seen that the threshold voltage fluctuates over time in the studied example (○), but such fluctuation is suppressed in the first embodiment (●). Note that the fluctuation of the threshold voltage shown in FIG. 21 includes the interface state component and the trap component due to the hydrogen ions in the gate insulating film described in FIG. 12.

In the foregoing, the present invention has been specifically described based on the embodiment, but it goes without saying that the present invention is not limited to the embodiment described above and can be modified in various ways within the range not departing from the gist thereof.

For example, in the above embodiment, an IGBT has been shown as an example of the device formed in the cell region 1A, but the technique disclosed in the above embodiments can be applied not only to the IGBT but also to a power MOSFET having a vertical trench gate.

What is claimed is:

1. A method of manufacturing a semiconductor device comprising steps of:
    (a) preparing a semiconductor substrate of a first conductivity type;
    (b) after the step (a), forming a trench in the semiconductor substrate;
    (c) after the step (b), forming a gate insulating film inside the trench and on the semiconductor substrate;
    (d) after the step (c), forming a first conductive film on the gate insulating film so as to fill an inside of the trench;
    (e) after the step (d), removing the first conductive film formed outside the trench, thereby forming a gate electrode made of the first conductive film inside the trench;
    (f) after the step (e), removing the gate insulating film formed on the semiconductor substrate;
    (g) after the step (f), forming a first insulating film on the semiconductor substrate;
    (h) after the step (g), forming a first impurity region of a second conductivity type opposite to the first conductivity type in the semiconductor substrate such that a bottom portion of the first impurity region is shallower than a bottom portion of the trench;
    (i) after the step (h), forming a second impurity region of the first conductivity type in the first impurity region; and
    (j) after the step (i), performing a hydrogen annealing process to the semiconductor substrate,
    wherein, in the step (g), the first insulating film is formed also between a side surface of the trench and the gate insulating film, and
    wherein a boundary between the first impurity region and the second impurity region is located at a position deeper than the first insulating film formed between the side surface of the trench and the gate insulating film.

2. The method of manufacturing the semiconductor device according to claim 1,
    wherein, in the step (f), a part of the gate insulating film in contact with a side surface of the gate electrode inside the trench is also removed, thereby exposing a part of the side surface of the gate electrode,
    wherein, in the step (g), the first insulating film is formed also on the exposed part of the side surface of the gate electrode, and
    wherein the boundary is located at a position deeper than the part of the side surface of the gate electrode exposed in the step (f).

3. The method of manufacturing the semiconductor device according to claim 2,
    wherein, in the step (c), the gate insulating film is formed by a thermal oxidation process using oxygen gas and water vapor, and
    wherein, in the step (g), the first insulating film is formed by a thermal oxidation process using oxygen gas.

4. The method of manufacturing the semiconductor device according to claim 3, wherein a thickness of the first insulating film formed on the semiconductor substrate is smaller than a thickness of the gate insulating film formed on the semiconductor substrate.

5. The method of manufacturing the semiconductor device according to claim 2,
wherein, in the step (f), anisotropic etching process is performed to the gate insulating film, and then isotropic etching process is performed to the gate insulating film.

6. The method of manufacturing the semiconductor device according to claim 1,
wherein, in the step (i), the second impurity region is formed by ion-implanting both arsenic and phosphorus.

7. The method of manufacturing the semiconductor device according to claim 6,
wherein the boundary is located at a position of 300 nm or more and 500 nm or less from an upper surface of the semiconductor substrate.

\* \* \* \* \*